(12) United States Patent
Tanaka et al.

(10) Patent No.: US 8,686,711 B2
(45) Date of Patent: Apr. 1, 2014

(54) HIGH-FREQUENCY MEASURING DEVICE AND HIGH-FREQUENCY MEASURING DEVICE CALIBRATION METHOD

(75) Inventors: Ryohei Tanaka, Osaka (JP); Yoshifumi Ibuki, Osaka (JP)

(73) Assignee: DAIHEN Corporation, Osaka (JP)

( * ) Notice: Subject to any disclaimer, the term of this patent is extended or adjusted under 35 U.S.C. 154(b) by 515 days.

(21) Appl. No.: 13/048,104

(22) Filed: Mar. 15, 2011

(65) Prior Publication Data

US 2011/0234201 A1    Sep. 29, 2011

(30) Foreign Application Priority Data

Mar. 24, 2010    (JP) .................................. 2010-067843

(51) Int. Cl.
*G01R 23/02* (2006.01)

(52) U.S. Cl.
USPC ....... 324/76.39; 216/59; 216/84; 156/345.24; 156/345.28; 156/345.43; 118/723 E; 315/111.21; 315/111.51; 427/8; 427/10; 438/10; 438/714; 702/107; 324/601

(58) Field of Classification Search
USPC .............................................. 324/76; 216/84
See application file for complete search history.

(56) References Cited

U.S. PATENT DOCUMENTS

| | | | |
|---|---|---|---|
| 5,467,013 A * | 11/1995 | Williams et al. ............... | 324/127 |
| 6,123,983 A * | 9/2000 | Smith et al. ....................... | 427/10 |
| 6,174,450 B1 * | 1/2001 | Patrick et al. .................... | 216/61 |
| 6,449,568 B1 * | 9/2002 | Gerrish ............................. | 702/60 |
| 6,521,080 B2 * | 2/2003 | Balasubramhanya et al. ......................... | 156/345.24 |
| 6,563,076 B1 * | 5/2003 | Benjamin et al. ........ | 219/121.54 |
| 6,805,810 B2 * | 10/2004 | Smith et al. ..................... | 216/60 |
| 6,863,020 B2 * | 3/2005 | Mitrovic et al. ........... | 118/723 E |
| 7,489,145 B2 * | 2/2009 | Matoba et al. ................. | 324/707 |
| 7,537,671 B2 * | 5/2009 | Vukovic .................... | 156/345.24 |
| 8,510,071 B2 * | 8/2013 | Tanaka .......................... | 702/107 |
| 2003/0136511 A1 * | 7/2003 | Balasubramhanya et al. ......................... | 156/345.25 |
| 2003/0136663 A1 * | 7/2003 | Smith et al. .............. | 204/192.13 |
| 2003/0137250 A1 * | 7/2003 | Mitrovic .................. | 315/111.21 |
| 2003/0209518 A1 * | 11/2003 | Liao et al. ........................ | 216/59 |
| 2004/0035365 A1 * | 2/2004 | Yamazawa et al. ........ | 118/723 E |
| 2005/0057165 A1 * | 3/2005 | Goodman ................. | 315/111.51 |
| 2006/0088655 A1 * | 4/2006 | Collins et al. ....................... | 427/8 |
| 2006/0258022 A1 * | 11/2006 | Wright ............................ | 438/10 |

(Continued)

FOREIGN PATENT DOCUMENTS

| | | |
|---|---|---|
| JP | 2004-309132 | 11/2004 |
| JP | 2007-163308 | 6/2007 |

*Primary Examiner* — Benjamin M Baldridge
(74) *Attorney, Agent, or Firm* — Hamre, Schumann, Mueller & Larson, P.C.

(57) ABSTRACT

A method for calibrating a high frequency measuring device so as to accurately measure plasma processing parameters within a chamber. A calibration parameter is calculated from a first set of three reference loads measured by a high frequency measurement device. A second calibration parameter is calculated from S parameters measured between a connection point where the high-frequency measuring device is connected and the inside of the chamber of a plasma processing device. A second set of three reference loads, which include the impedance previously calculated and encompass a range narrower than that encompassed by the first set of three reference loads, is measured with the reference loads in the chamber. Another calibration parameter is calculated from the measured impedances of the second set of three reference loads measured by the high- frequency measuring device, and the true values of those impedances, and a detected voltage signal and a detected current signal are calibrated using the above calibration parameters.

16 Claims, 7 Drawing Sheets

(56) References Cited

U.S. PATENT DOCUMENTS

| | | | |
|---|---|---|---|
| 2008/0029484 A1* | 2/2008 | Park et al. .................. | 216/67 |
| 2008/0078504 A1* | 4/2008 | Vukovic .................. | 156/345.28 |
| 2008/0081482 A1* | 4/2008 | Brcka et al. .................. | 438/714 |
| 2008/0237031 A1* | 10/2008 | Sato .................. | 204/164 |
| 2009/0026172 A1* | 1/2009 | Kitabata et al. .................. | 216/84 |
| 2009/0242132 A1* | 10/2009 | Sato .................. | 156/345.43 |
| 2010/0258530 A1* | 10/2010 | Toyoda et al. .................. | 216/84 |
| 2011/0238356 A1* | 9/2011 | Tanaka .................. | 702/107 |
| 2012/0084037 A1* | 4/2012 | Tanaka .................. | 702/85 |
| 2012/0249161 A1* | 10/2012 | Tabuchi .................. | 324/601 |

* cited by examiner

HIGH-FREQUENCY MEASURING DEVICE AND HIGH-FREQUENCY MEASURING DEVICE CALIBRATION METHOD

BACKGROUND OF THE INVENTION

1. Field of the Invention

The present invention relates to a high-frequency measuring device that detects high-frequency voltage and high-frequency current and measures that voltage and current by calculating high-frequency parameters such as an impedance, and to a calibration method for such a high-frequency measuring device.

2. Description of the Related Art

In the past, plasma processing systems have been developed that process processed articles such as semiconductor wafers or liquid crystal substrates using a method such as etching by supplying high-frequency electrical power output from a high-frequency power supply device to a plasma processing device. See, for example, Japanese Patent Application Laid-open Nos. 2007-163308 and 2004-309132.

FIG. 11 is a block diagram showing the configuration of a typical plasma processing system.

Since an impedance of a plasma processing device 400 fluctuates during plasma processing, there is the risk of a reflected power reflected at an input end of the plasma processing device 400 damaging a high-frequency power supply device 100. Thus, an impedance matching device 200 is typically provided in a plasma processing system A100 between the high-frequency power supply device 100 and the plasma processing device 400, and the impedance matching device 200 carries out a matching operation corresponding to fluctuations in the impedance of the plasma processing device 400. In addition, it is necessary to monitor the impedance of the plasma processing device 400 and high-frequency voltage and high-frequency current and the like at the input end of the plasma processing device 400 during plasma processing.

Monitoring of the plasma processing device 400 is carried out using various high-frequency parameters measured by a high-frequency measuring device 300 provided at the input end of the plasma processing device 400.

Together with the high-frequency measuring device 300 detecting high-frequency voltage (to be simply referred to as "voltage") and high-frequency current (to be simply referred to as "current") and determining a phase difference $\theta$ of the voltage and current from the detected values (to be simply referred to as "phase difference"), it also calculates high-frequency parameters such as an effective voltage value V, an effective current value I, an impedance Z=R+jX, a reflection coefficient $\Gamma$, a forward power Pf input to the plasma processing device 400, and a reflected power Pr reflected at the input end of the plasma processing device 400 due to impedance mismatch.

The high-frequency measuring device 300 has a capacitor capacitatively coupled to a rod-shaped semiconductor for transmitting electrical power to the plasma processing device 400 and a coil magnetically coupled to the body portion thereof, and detects a voltage $v=\sqrt{2} \cdot V \cdot \sin(\omega t)$ with the capacitor or a current $i=\sqrt{2} \cdot I \cdot \sin(\omega t + \theta)$ with the coil. In addition, the high-frequency measuring device 300 determines the effective voltage value V, the effective current value I and the phase difference $\theta$ from a detected voltage v and current i, and then calculates the high-frequency parameters described above using these values according to the following equations (1) to (5). Namely, the high-frequency measuring device 300 is referred to as a so-called RF sensor provided with sensors for detecting the voltage v and current i, and an arithmetic processing circuit for calculating the high-frequency parameters from the detected values of those sensors.

$$R = \frac{V}{I} \cos\theta \quad (1)$$

$$X = \frac{V}{I} \sin\theta \quad (2)$$

$$Z = R + jX \quad (3)$$

$$\Gamma = \sqrt{\left(\frac{R^2 + X^2 - 1}{(R+1)^2 + X^2}\right)^2 + \left(\frac{2X}{(R+1)^2 + X^2}\right)^2}$$

$$Pf = \frac{VI\cos\theta}{1 - \Gamma^2} \quad (4)$$

$$Pr = Pf\Gamma^2 \quad (5)$$

In general, since values detected with sensors differ from the correct values due to variations in sensor sensitivity, monitoring devices and measuring devices are typically composed to acquire calibration data that converts detected values to correct values by preliminarily measuring a measured object serving as a reference, and then correcting detected values to correct detection values with the calibration data during actual measurement.

Short-Open-Load-Thru (SOLT) calibration is used to calibrate the voltage v and current i detected by the high-frequency measuring device 300. SOLT calibration consists of first connecting the high-frequency measuring device 300 to a standard having a preliminarily specified true value of an impedance, and then measuring the impedance with the high-frequency measuring device 300. A dummy load having a characteristic impedance of the measurement system (characteristic impedance of a transmission line that transmits high-frequency waves for measurement, and typically an impedance of 50 or 75$\Omega$) and dummy loads having an impedance close to each of an open-circuit impedance (an infinitely large impedance) and a short-circuit impedance (a zero impedance), are used as standards. Next, calibration parameters for calibrating the voltage v and the current i calculated from an impedance of each standard measured by the high-frequency measuring device 300 and a true value of the impedance of each standard, and then recorded in memory (not shown) of the high-frequency measuring device 300. During actual measurement, each high-frequency parameter is calculated after having corrected the detected voltage v and current i with the calibration parameters recorded in memory.

However, since the above-mentioned calibration parameter was determined so as to be able to carry out calibration over an extremely wide range of impedance, the accuracy of calibration according to this calibration parameter is not sufficiently high. In addition, in the calibration described above, an impedance is measured by directly connecting the high-frequency measuring device 300 to each standard, and the calibration parameter is calculated based on this measured impedance. In other words, this calibration parameter calibrates various high-frequency parameters at an output end of the high-frequency measuring device 300. Thus, an effective voltage value V and effective current value I that have been measured after calibrating in this manner are the effective voltage value and effective current value at the output end of the high-frequency measuring device 300, while the impedance Z is an impedance as viewed from the output end of the high-frequency measuring device 300 towards the load side. However, various high-frequency parameters are required to be measured within the chamber of the plasma processing device 400 in order to monitor the plasma processing device 400.

In the case of directly connecting the high-frequency measuring device 300 and the plasma processing device 400, although the effective voltage value, the effective current value and the impedance at the output end of the high-frequency measuring device 300 can be considered to be equivalent to the effective voltage value, the effective current value and the impedance within the chamber of the plasma processing device 400, in the case of installing the high-frequency measuring device 300 and the plasma processing device 400 separated by a distance there between, the effect of parasitic capacitance of a transmission line (such as a coaxial cable) between the high-frequency measuring device 300 and the plasma processing device 400 becomes large, thereby preventing monitoring of the plasma processing device 400 with the high-frequency measuring device 300.

For example, measured values of the high frequency measuring device 300 may be used for an E chuck controller. An E chuck controller controls the strength of an electrostatic chuck for immobilizing a wafer in the chamber of the plasma processing device 400 based on measured effective current and effective voltage values. Thus, necessary to measure effective voltage and control values within the chamber with high accuracy. However, in the case of installing the high-frequency measuring device 300 and the plasma processing device 400 separated by a distance there between, it is difficult to control the strength of the electrostatic chuck based on effective voltage and current values measured by the high-frequency measuring device 300. Moreover, since plasma electron density is closely related to electrode voltage and current, it is still necessary to accurately measure effective voltage and current values even in the case of estimating plasma parameters.

SUMMARY OF THE INVENTION

With the foregoing in view, an object of the present invention is to provide a high-frequency measuring device able to accurately measure various high-frequency parameters within the chamber of a plasma processing device even if installed at a location at a distance from the plasma processing device, and to provide a method for calibrating that high-frequency measuring device.

The present invention devises the following technical means for solving the above-mentioned problems.

A calibration method provided according to a first aspect of the present invention is a method for calibrating voltage values and current values of a high-frequency measuring device that is connected between a plasma processing device for generating plasma within a chamber and a high-frequency power supply device for supplying high-frequency electrical power to the plasma processing device, detects high-frequency voltage and high-frequency current at the connection point, and calculates an impedance within the chamber of the plasma processing device based on the detected voltage and current values, comprising: a first step of calculating a first parameter for calibrating the voltage and current values based on an impedance calculated when the high-frequency measuring device is connected to a first set of three reference loads and impedances of the first set of three reference loads, and setting the first parameter in the high-frequency measuring device; a second step of calculating a second parameter for respectively converting the detected voltage and current values to voltage and current values within the chamber, and setting the second parameter in the high-frequency measuring device; a third step of carrying out plasma processing by connecting the high-frequency measuring device to a plasma processing device to be measured, calibrating the detected voltage and current values using the first parameter and the second parameter, and, calculating an impedance within the chamber based on the calibrated voltage and current values; a fourth step of determining three impedances that encompass, when displayed on a Smith chart, a narrower range than a range encompassed by the impedances of the first set of three reference loads, the narrower range including the impedances calculated in the third step; a fifth step of calculating a third parameter for further calibrating the voltage and current values calibrated using the first parameter and the second parameter, based on an impedance measured by the high-frequency measuring device connected to the plasma processing device when a second set of three reference loads respectively having the three impedances is arranged within the chamber of the plasma processing device to be measured and the impedances of the second set of three reference loads, and setting the third parameter in the high-frequency measuring device; and a sixth step of connecting the high-frequency measuring device to the plasma processing device to be measured and calibrating detected voltage and current values, using the first parameter, the second parameter and the third parameter.

Furthermore, examples of "detected voltage and current values" include digitally converted voltage and current values, effective voltage and current values, and maximum voltage and current values.

In a preferred embodiment of the present invention, the second parameter is calculated from an S parameter measured between the connection point and within the chamber of the plasma processing device.

In a preferred embodiment of the present invention, one of the reference loads among the first set three reference loads has an impedance equal to a characteristic impedance of the high-frequency measuring device.

In a preferred embodiment of the present invention the plasma processing device has a pair of opposing plate electrodes.

A high-frequency measuring device provided according to a second aspect of the present invention is a high-frequency measuring device that is connected between a plasma processing device for generating plasma within a chamber and a high-frequency power supply device for supplying high-frequency electrical power to the plasma processing device, and detects high-frequency voltage and high-frequency current at the connection point, comprising: a voltage detector for detecting high-frequency voltage at the connection point; a current detector for detecting high-frequency current at the measurement point; a calibrator for calibrating a voltage value detected by the voltage detector and a current value detected by the current detector; and an impedance calculator for calculating an impedance within the chamber of the plasma processing device based on the voltage and current values calibrated by the calibrator, wherein the calibrator is provided with a first calibration unit for calibrating the detected voltage and current values using a first parameter calculated based on an impedance calculated by the impedance calculator when the high-frequency measuring device is connected to a first set of three reference loads and impedances of the first set of three reference loads; a second calibration unit for calibrating the voltage and current values calibrated by the first calibration unit, using a second parameter for respectively converting the detected voltage and current values to voltage and current values within the chamber; and a third calibration unit for further calibrating the voltage and current values calibrated by the first calibration unit and the second calibration unit, using a third parameter calculated based on an impedance measured by the frequency measuring device connected to the plasma processing device when a second set of three reference loads, which encompass a range narrower than a range encompassed by the impedances of the first set of three reference loads when displayed on a Smith chart, is arranged in the chamber of a plasma processing device to be measured, and impedances of the second set of three reference loads.

In a preferred embodiment of the present invention, the second parameter is calculated from an S parameter measured between the connection point and within the chamber of the plasma processing device.

In a preferred embodiment the present invention, one of the reference loads among the first set of three reference loads has an impedance equal to a characteristic impedance of the high-frequency measuring device.

In a preferred embodiment of the present invention, the plasma processing device has pair of opposing plate electrodes.

According to the present invention, an impedance within the chamber of a plasma processing device is calculated; based on calibrated voltage and current values. First, voltage and current values detected by connecting a plasma processing device to be measured are calibrated according to a first parameter calculated based on a first set of three reference loads and a second parameter for respectively converting the detected voltage and current values to voltage and current values within the chamber to a calculated impedance. Next, three impedances having a narrower range are determined based on the calculated impedance. The detected voltage and current values are calibrated according to the first parameter, the second parameter and a third parameter calculated based on a second set of three reference loads respectively having the three impedances.

The third parameter is determined in order to calibrate only an impedance range narrower than that of the first parameter, and in the case an impedance is within that range, accuracy of calibration according to the third parameter is sufficiently high. Thus, detected voltage current values can be calibration with high accuracy. In addition, since the second parameter respectively converts detected voltage and current values to voltage and current values within the chamber, voltage and current values within the chamber can be detected. Thus, various types of high-frequency parameters of a plasma processing device can be accurately measured even in cases in which the high-frequency measuring device is installed at a location at a distance from the plasma processing device.

Other characteristics and advantages of the present invention will become clearer from the detailed explanation provided below with reference to the appended drawings.

DETAILED DESCRIPTION OF PREFERRED EMBODIMENTS

The following provides a detailed explanation of embodiments of the present invention with reference to the appended drawings by using as an example the case of a high-frequency measuring device used to monitor a plasma processing device.

Figure 1A:
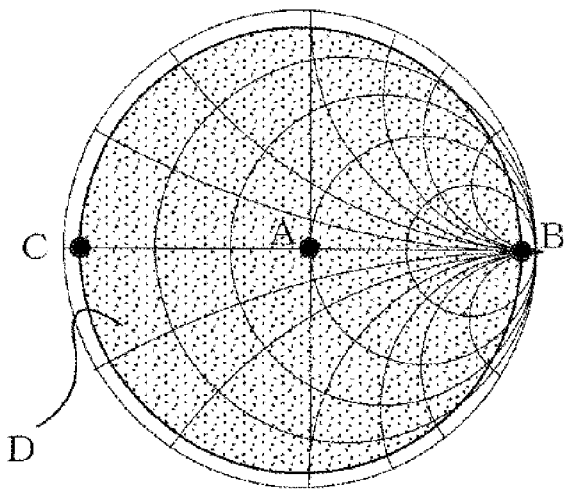
FIGS. 1A-1C illustrate the concept of the calibration method according to the present invention.

FIG. 1 is a drawing for explaining the concept of the calibration method according to the present invention, and indicates the locations of each impedance on a Smith chart.

Points A, B and C in FIG. 1 respectively indicate the locations of an impedance of 5Ω that is the characteristic impedance, an impedance close to open-circuit impedance (an infinitely large impedance) and a impedance, close to short-circuit impedance (a zero impedance). A calibration parameter calculated by using points A, B and C as references enables calibration to be carried out over a range D encompassed by points A, B and C, namely over nearly the entire range of the impedances on the Smith chart. However, since an impedance within the chamber of a plasma processing device in which the high-frequency measuring device actually carries out measurements (to be referred to as the "device to be measured") does not change over that wide an impedance range, it is not necessary to carry out calibration over nearly the entire impedance range. In other words, highly accurate calibration is expected to be carried out over a narrow impedance range rather than carrying out calibration of low accuracy over a wide impedance range.

Figure 1B:
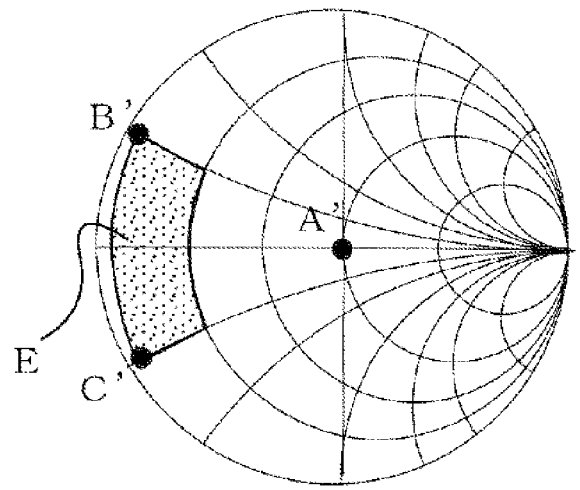

For example, in the case an impedance within the chamber of a device to be measured changes only within range E in FIG. 1B, it is not necessary to consider calibrating at an impedance other than over the range E. In this case, if a calibration parameter is calculated using the impedances of points A', B' and C' that encompass range E as references and calibration is carried out with that calibration parameter, calibration can be carried out more accurately than in the case of carrying out calibration with a calibration parameter calculated by using the impedances of points A, B and C as references. However, in the case an impedance within the chamber of the device to be measured is outside the range encompassed by points A', B' and C', the accuracy of calibration becomes lower than in the case of calibrating with a calibration parameter calculated by using the impedance of points A, B and C as references. Thus, it is necessary to determine points A', B' and C' so as to include the range of change of the impedance within the chamber of the device to be measured.

It is necessary to measure an impedance within the chamber of the device to be measured that actually carries out plasma processing in order to determine points A', B' and C'.

Figure 1C:
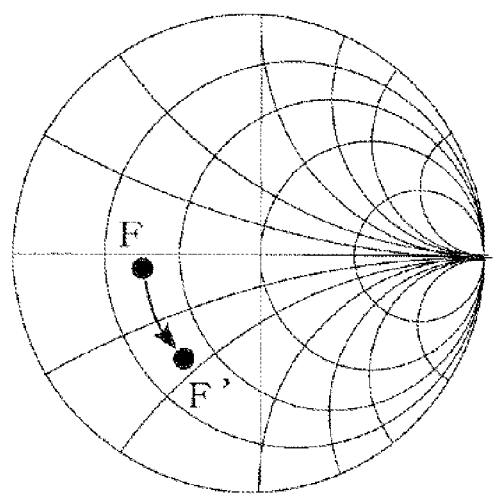

Since the range of change of the impedance is not known when measuring this impedance, it is necessary to use a calibration parameter that enables calibration over as wide a range of impedance as possible. Thus, a calibration parameter is used that has been calculated using the impedances of points A, B and C as references. However, this calibration consists of calibrating detected values at the connection point where the high-frequency measuring device is connected, and an impedance calculated from detected values following calibration is an impedance as viewed from the connection point towards the load side. Thus, in the case the high-frequency measuring device and the device to be measured are installed at a distance from each other, the high-frequency measuring device measures an impedance that additionally contains parasitic capacitance of the transmission line between the high-frequency measuring device and the device to be measured. For example, even if an impedance within the chamber of the device to be measured is an impedance at point F' in FIG. 1C, as a result of the addition of parasitic capacitance of the transmission line, the impedance at point F' in FIG. 1C is measured. Thus, in the present invention, calibration is carried out so as to cancel out the amount of change in the impedance attributable to parasitic capacitance.

The present invention carries but multistage calibration consisting of confirming the range of change of an impedance within the chamber of a device to be measured by calibrating with a calibration parameter that allows calibration at low accuracy over a wide impedance range and carrying out calibration that cancels out parasitic capacitance of a transmission line, and then calibrating with a calibration parameter that allows calibration at high accuracy only over that range of change.

First, in order to confirm the range of change of impedance of the device to be measured, a first calibration parameter is calculated and set that allows calibration to be carried out at low accuracy over a wide range of impedance. The method used to calculate the first calibration parameter will be described later. A second calibration parameter is calculated and set for carrying out calibration that cancels out parasitic capacitance of a transmission line. The method used to calculate the second calibration parameter will be described later. An impedance during plasma processing is then measured by connecting a high-frequency measuring device to the device to be measured. This measured value of impedance is calculated based on current and voltage values calibrated with the first calibration parameter and the second calibration parameter. Thus, although accuracy is low, the range of the impedance within the chamber during plasma processing can be confirmed. Next, a third calibration parameter is calculated and set that allows calibration to be carried out with high accuracy only over a narrow impedance range that includes the confirmed impedance range. The method used to calculate the third calibration parameter will be described later. Highly accurate calibration of detected current and voltage values can be carried out by calibrating with the first calibration parameter, the second calibration parameter and the third calibration parameter.

Figure 2:
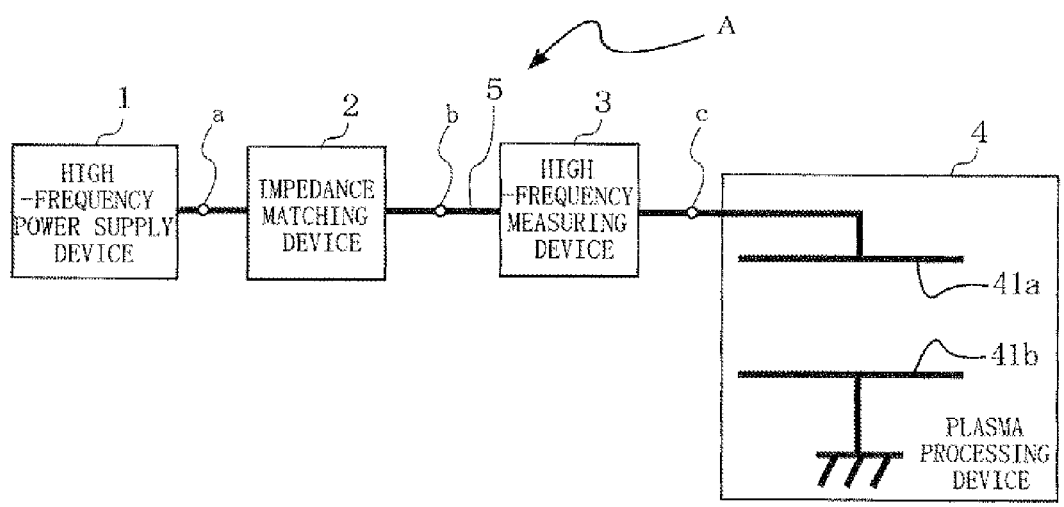
FIG. 2 is a block diagram for explaining the configuration of a plasma processing system that uses a high-frequency measuring device according to a first embodiment.

FIG. 2 is a block diagram for explaining the configuration of a plasma processing system using a high-frequency measuring device according to a first embodiment.

A plasma processing system A carries out processing such as plasma etching by supplying high-frequency electrical power to a processed article such as a semiconductor wafer or liquid crystal substrate. As shown in this drawing, the plasma processing system A is provided with a high-frequency power supply device 1, an impedance matching device 2, a high-frequency measuring device 3 and a plasma processing device 4. The impedance matching device 2 is connected to the high-frequency power supply device 1 via a transmission line composed of, for example, a coaxial cable, and the plasma processing device 4 is connected to the impedance matching device 2 via a transmission line 5 composed of, for example, a coaxial cable. The high-frequency measuring device 3 is installed at a location on the transmission line 5, at a distance from the plasma processing device 4. Furthermore, the plasma processing system A is composed as a system having a characteristic impedance of 50Ω.

The high-frequency power supply device 1 is a power supply device that supplies high-frequency electrical power and is capable of outputting high-frequency electrical power having a frequency of, for example, several hundred kHz or more.

The impedance matching device 2 matches an impedance of the high-frequency power supply device 1 and the plasma processing device 4. The impedance matching device 2 is provided with a variable reactance element not shown (such as a variable capacitor or variable inductor), and changes an impedance by changing the reactance of the variable reactance element. The impedance matching device 2 converts an impedance as viewed from an output end b of the impedance matching device 2 towards the load side so that an impedance as viewed from an input end a of the impedance matching device 2 towards the load becomes characteristic impedance.

Furthermore, a high-frequency measuring device not shown is provided on the power supply side within the impedance matching device 2. This high-frequency measuring device measures an impedance as viewed from the input end a of the impedance matching device 2 towards the load side, and the impedance matching device 2 changes the reactance of the variable reactance element so that the measured impedance becomes the characteristic impedance.

The plasma processing device 4 is a device for processing a processed article such as a semiconductor wafer or liquid crystal substrate using a method such as etching or CVD. Furthermore, the plasma processing device 4 is a capacitively coupled plasma (CCP) type of plasma processing device that is provided with a container (chamber) (not shown) for sealing a prescribed gas such as nitrogen gas or argon gas for generating plasma, and a pair of opposing plate electrodes 41a and 41b for supplying high-frequency electrical power from the high-frequency power supply device 1 to gas within the chamber. The plate electrode 41a is connected to a transmission line 5, and the plate electrode 41b is connected to ground. The plasma processing device 4 carries out processing on a processed article within the chamber by generating plasma between the plate electrode 41a and the plate electrode 41b by using high-frequency electrical power supplied from the high-frequency power supply device 1.

The high-frequency measuring device 3 is a so-called RF sensor that measures high-frequency parameters of the plasma processing device 4 such as an impedance, a reflection coefficient, high-frequency voltage, a high-frequency current, a forward power and a reflected power in order to monitor the status of the plasma processing device 4 during plasma processing.

Figure 3:
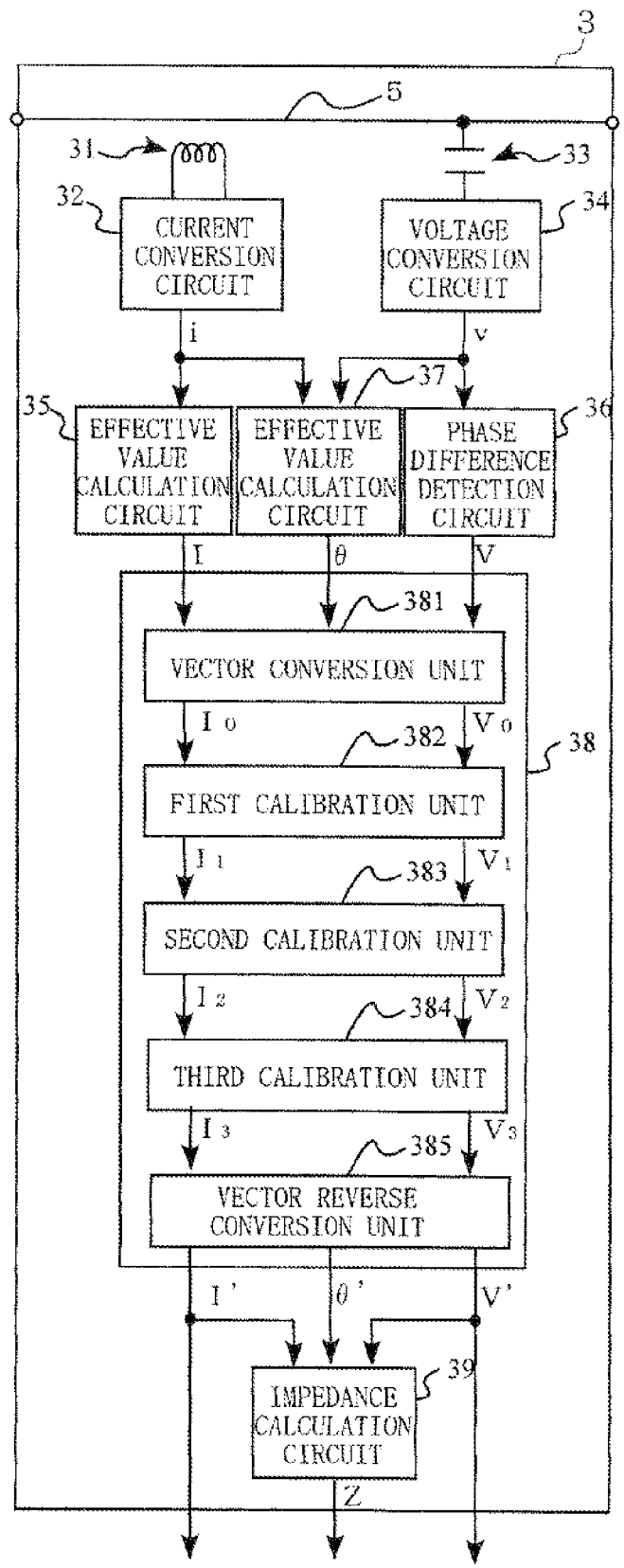
FIG. 3 is a block diagram felt explaining the internal configuration of a high-frequency measuring device according to a first embodiment.

FIG. 3 is a block diagram for explaining the internal configuration of the high-frequency measuring device 3.

As shown in the drawing, the high-frequency measuring device 3 is provided with a current transformer unit 31, a current conversion circuit 32, a capacitor unit 33, a voltage conversion circuit 34, effective value calculation circuits 35 and 36, a phase difference detection circuit 37, a calibration circuit 38 and an impedance calculation circuit 39.

The current transformer unit 31 detects current corresponding to high-frequency current flowing to the transmission line 5, and the detected current is output to the current conversion circuit 32. The current conversion circuit 32 converts the input current to a digital current signal i and outputs that current signal i to the effective value calculation circuit 35 and the phase difference detection circuit 37. The capacitor unit 33 detects voltage corresponding to high-frequency voltage generated in the transmission line 5, and outputs the detected voltage to the voltage conversion circuit 34. The voltage conversion circuit 34 converts the input voltage to a digital voltage signal v and outputs that voltage signal to the effective value calculation circuit 36 and the phase difference detection circuit 37.

The effective value calculation circuit 35 calculates an effective current value. The effective value calculation circuit 35 calculates an effective current value I from the current signal i input from the current conversion circuit 32, and outputs the effective current value I to the calibration circuit 38. The effective value calculation circuit 36 calculates an effective voltage value. The effective value calculation circuit 36 calculates an effective voltage value V from the voltage signal v input from the voltage conversion circuit 34, and outputs the effective voltage value V to the calibration circuit 38. The phase difference detection circuit 37 detects the phase difference of current and voltage. The phase difference detection circuit 37 calculates the phase difference θ from the current signal i input from the current conversion circuit 32 and the voltage signal v input from the voltage conversion circuit 34, and outputs the phase difference θ to the calibration circuit 38.

The calibration circuit 38 carries out calibration of the effective current value I, the effective voltage value V and the phase difference θ. The calibration circuit 38 calibrates the effective current value I input from the effective value calculation circuit 35, the effective voltage value V input from the effective value calculation circuit 36 and the phase difference θ input from the phase difference detection circuit 37, and outputs a calibrated effective current value I', a calibrated effective voltage value V' and a calibrated phase difference θ' to the impedance calculation circuit 39.

The calibration circuit 38 is provided with a vector conversion unit 381, a first calibration unit 382, a second calibration unit 383, a third calibration unit 384, and a vector reverse conversion unit 385, and carries out three-stage calibration on current and voltage vectors. The vector conversion unit 381 calculates a current signal $I_0$ vector and a voltage signal, $V_0$ vector from the input effective current value I, the effective voltage value V and the phase difference θ, and outputs the current signal and voltage signal vectors to the first calibration unit 382. The current signal $I_0$ and the voltage signal $V_0$ are calculated with $I_0=I+j0$ and $V_0=V\cos\theta+jV\sin\theta$ using the phase of the current signal $I_0$ as a reference (real axis, virtual component 0). The first calibration unit 382 carries out a first stage of calibration on the current signal $I_0$ and the voltage signal $V_0$ input from the vector conversion unit 381 using a first calibration parameter X recorded in memory not shown, and outputs a current signal and voltage signal $V_1$ to the second calibration unit 383 following calibration. The second calibration unit 383 carries out a second stage of calibration on the current signal I and voltage signal $V_1$ input from the first calibration unit 382 using a second calibration parameter X' recorded in memory, and outputs a current signal $I_2$ and voltage signal $V_2$ to the third calibration unit 384 following calibration. The third calibration unit 384 carries out a third stage of calibration on the current signal $I_2$ and the voltage signal $V_2$ input from the second calibration unit 383 using a third calibration parameter X" recorded in memory, and outputs a current signal $I_3$ and the voltage signal $V_3$ to the vector reverse conversion unit 385 following calibration. The vector reverse conversion unit 385 calculates and outputs the calibrated effective current value I', effective voltage value V' and phase difference O'from the calibrated current signal $I_3$ and voltage signal $V_3$ input from the third calibration unit 384.

The first calibration parameter X and the third calibration parameter X' are respectively calculated based on three reference loads and recorded in memory. The following providers an explanation of a method for calculating the first calibration parameter X.

Figure 4A:
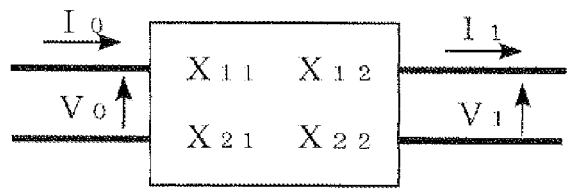
FIGS. 4A and 4B illustrate calibration parameters.

When the relationship between the current signal $I_0$ and voltage signal $V_0$ output from the vector conversion unit 381 and the high-frequency current flowing to the transmission line 5 and the high-frequency voltage generated in the transmission line 5 is replaced with a two-terminal pair network, the first calibration parameter X that calibrates the current signal $I_0$ and the voltage signal $V_0$ to the current signal $I_1$ and the voltage signal $V_1$ can be considered to be a two-dimensional vector matrix as shown in FIG. 4A.

Respective elements $X_{11}$, $X_{12}$, $X_{21}$ and $X_{22}$ of the first calibration parameter X can be calculated by connecting the high-frequency measuring device 3 to three reference loads, measuring the impedance of each with the high-frequency measuring device 3, and using these measured impedance values and the true impedances of the three reference loads. Furthermore, in order to carry out these calculations, absolute values of voltage and current are required for use as references. Highly accurate electrical power measured values are required in order to use the absolute values of voltage and current as references. Measuring by connecting a load for which reflected power is zero is the best way to measure highly accurate electrical power measured values. Thus, in the present embodiment, a reference load having an impedance equal to the characteristic impedance (namely, 50Ω) is selected for one of the reference loads in order to realize zero reflected power. Furthermore, since the reason for using a load having the characteristic impedance as one of the reference loads is to measure highly accurate electrical power measured values as previously described, a load other than that having the characteristic impedance may be used provided it enables measurement of electrical power measured values with high accuracy.

In the case of actually connecting the high-frequency measuring device to a reference load and measuring an impedance of the reference load the high-frequency measuring device 3 is unable measure an impedance at the input end of the reference and an impedance of the high-frequency measuring device 3 per se is included in the measured impedance. Thus, the first calibration parameter X cannot be calculated using the impedance of the reference load only as the true value of impedance. In the present embodiment, the total of the connected loads and the high-frequency measuring device 3 is treated as the reference load, the impedance of that reference load is measured with an impedance analyzer, and the first calibration parameter X is calculated by using that measured value as the true value of the reference load.

Furthermore, loads respectively having an impedance close to the open-circuit impedance and the short-circuit impedance are preferably used for two of the reference loads in order to include as wide an impedance range as possible. On the other hand, in the case of using a load having an impedance excessively close to the open-circuit impedance or the short-circuit impedance as a reference load, one of the voltage value or current value detected by the high-frequency measuring device 3 becomes extremely small in comparison with the other. In this case, the respective elements $X_{11}$, $X_{12}$, $X_{21}$ and $X_{22}$ of the first calibration parameter X cannot be suitably calculated. Thus, in the present embodiment, loads having a magnitude of the reflection coefficient of, for example, 0.9 or less are used as reference loads.

Figure 5:
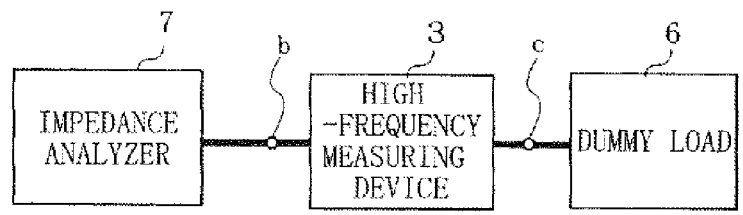
FIG. 5 is a drawing for explaining a method for measuring an impedance of a reference lead that is carried, out to calculate each element of a first calibration parameter.

FIG. 5 is a drawing for explaining a method of measuring an impedance of a reference load that is carried out to calculate the respective elements $X_1$, $X_{12}$, $X_{21}$ and $X_{22}$ of the first calibration parameter X.

As shown in the drawing, this measurement is carried but by connecting a dummy load 6 to an output end c of the high-frequency measuring device 3, and connecting impedance analyzer 7 to and input end b of the high-frequency measuring device 3.

The dummy load 6 is a load device for reproducing prescribed reference load, and converts an impedance as viewed from the input end b of the high-frequency measuring device 3 towards the load side, namely the total impedance of the dummy load 6 and the high-frequency measuring device 3, to a prescribed reference load impedance the dummy load 6 changes an impedance by changing the reactance of a variable reactance element not shown (such as a variable capacitor or variable inductor). The dummy load 6 is set in advance so as to be able to reproduce prescribed reference loads consisting of a reference load having the characteristic impedance (50Ω) and two reference loads having reflection coefficients of 0.9 or less that are close to the open-circuit impedance and the short-circuit impedance, respectively. Furthermore, instead of reproducing the three prescribed reference loads by connecting the dummy load 6 and switching the settings thereof, three loads for reproducing the prescribed reference loads may be connected in sequence.

The impedance analyzer 7 is used to measure an impedance, and measures an impedance as viewed from the input end b of the high-frequency measuring device 3 towards the load side, namely an impedance of a reference load.

Measurement of the impedances of the reference loads for calculating the first calculation parameter X is carried out by reproducing each reference load and measuring each impedance with the impedance analyzer 7 and the highfrequency measuring device 3. Furthermore, the impedance analyzer 7 need not be used if the method used allows the a obtaining of true values of the impedance measured by the high-frequency measuring device 3.

The respective elements $X_{11}$, $X_{12}$, $X_{21}$ and $X_{22}$ of the first calibration parameter X can be calculated from the impedance measured values of the three reference loads measured by the high-frequency measuring device 3 and the true impedance values of the three reference loads. The current signal $I_0$ and the voltage signal $V_0$ can be converted to the calibrated current signal $I_1$ and calibrated voltage signal $V_1$ according to FIG. 4A using the calculated first calibration parameter X. Namely, the calibrated current signal $I_1$ and calibrated voltage signal $V_1$ can be calculated according to the following equations (6) and (7) derived from FIG. 4A.

$$\begin{bmatrix} V_0 \\ V_1 \end{bmatrix} = \begin{bmatrix} X_{11} & X_{12} \\ X_{21} & X_{22} \end{bmatrix} \begin{bmatrix} I_0 \\ -I_1 \end{bmatrix} \quad (6)$$

$$V_0 = X_{11}I_0 - X_{12}I_1$$
$$V_1 = X_{21}I_0 - X_{22}I_1$$

$$I_1 = \frac{X_{11}}{X_{12}}I_0 - \frac{1}{X_{12}}V_0$$

$$V_1 = \frac{(X_{12}X_{21} - X_{11}X_{22})}{X_{12}}I_0 + \frac{X_{22}}{X_{12}}V_0 \quad (7)$$

The second calibration parameter X' is used to convert high-frequency current and high-frequency voltage at the connection point where the high-frequency measuring device 3 is connected to high-frequency current and high-frequency voltage within the chamber of the plasma processing device 4. In other words, the second calibration parameter X' can be considered to convert the detection point of high-frequency current and high-frequency voltage from the connection point where the high-frequency measuring device 3 is connected to inside the chamber of the plasma processing device 4. The second calibration parameter X' is calculated from a parameter S between the input end b of the high-frequency measuring device 3 (equivalent to the connection point where the high-frequency measuring device 3 is connected) and the plate electrode 41a on the electrical power supply side within the chamber of the plasma processing device 4, and then recorded in memory. The following provides an explanation of a method for calculating the second calibration parameter X'.

Figure 6:
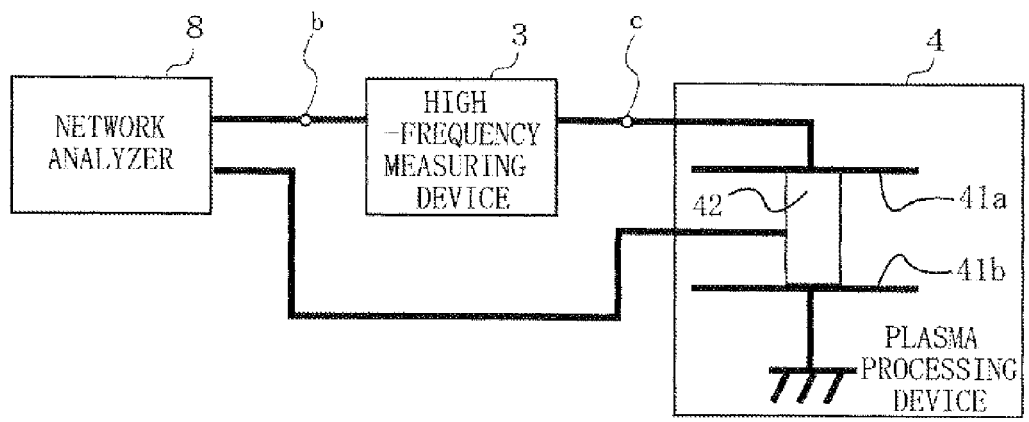
FIG. 6 is a drawing for explaining a method for measuring an S parameter that is carried out to calculate a second calibration parameter.

FIG. 6 is a drawing for explaining a method for measuring the S parameter between the input end b of the high-frequency measuring device 3 and the plate electrode 41a on the electrical power supply side within the chamber of the plasma processing device 4 that is carried out in order to calculate the second calibration parameter X'.

As shown in the drawing, the S parameter is measured with a network analyzer 8 by connecting the plasma processing device 4 to the output end c of the high-frequency measuring device 3. The high-frequency measuring device 3 is connected to the plasma processing device 4 in the same manner as the plasma processing system A that is actually used (see FIG. 2). The connector on the input side (not shown) of the network analyzer 8 is connected to the input end b of the high-frequency measuring device 3, and the connector on the output side (not shown) is connected to an adapter 42. The adapter 42 is arranged between the plate electrodes 41a and 41b within the chamber of the plasma processing device 4. However, a material having impedance characteristics so as to be open from the viewpoint of high-frequency waves is preferably selected for use as the material of the adapter 42.

The network analyzer 8 is a measuring device that measures various parameters of a linear circuit network, and measures the parameter S of the circuit network between the input end b of the high-frequency measuring device 3 and the plate electrode 41a on the electrical power supply side within the chamber of the plasma processing device 4. The adapter 42 is for connecting a connector on the output side of the network analyzer 8 to the plate electrode 41a of the plasma processing device 4. Furthermore, there are no particular limitations on the shape, size or configuration and the like of the adapter 42 provided it is configured so as to minimize the effects of the network analyzer 8 on measured values as well as enable the connector on the output side of the network analyzer 8 to be connected to the plate electrode 41a of the plasma processing device 4.

Figure 7:
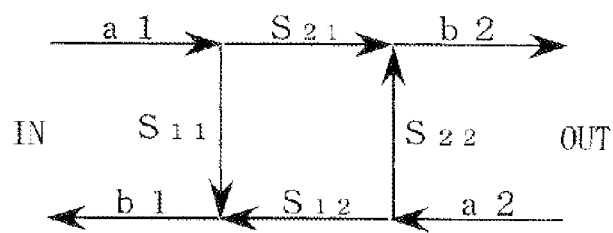
FIG. 7 is a drawing indicating the relationship between an S parameter and forward power and reflected power at an input side and output side.

FIG. 7 indicates the relationship between the parameter S and an incident wave a1 and reflected wave b1 on the input side, and an incident wave a2 and reflected wave b2 on the output side. Furthermore, IN represents the input side, while OUT represents the output side.

Representation of the relationship shown in FIG. 7 in the form of a matrix yields the following equation (8). Expanding this equation results in the following equation (9), and a2 and b2 can be represented by the equations of a1 and b1 as shown in the following equation (10).

$$\begin{bmatrix} b1 \\ b2 \end{bmatrix} = \begin{bmatrix} S_{11} & S_{12} \\ S_{21} & S_{22} \end{bmatrix} \begin{bmatrix} a1 \\ a2 \end{bmatrix} \quad (8)$$

$$b1 = S_{11}a1 + S_{12}a2 \quad (9a)$$

$$b2 = S_{21}a1 + S_{22}a2 \quad (9b)$$

$$a2 = \frac{b1 - S_{11}a1}{S_{12}} \quad (10a)$$

$$b2 = \frac{S_{22}b1 - (S_{11}S_{22} - S_{12}S_{21})a1}{S_{12}} \quad (10b)$$

On the other hand, the relationship between input side current signal $I_1$ and voltage signal $V_1$ and input side incident wave a1 and reflected b1 is represented by the following equations (11). Furthermore, a characteristic impedance of the measuring system shown in FIG. 7 is 50Ω. According to the following equations (11), a1 and b1 can be represented with the equation for $V_1$ as shown in the following equations (12).

$$I_1 = \frac{a1 - b1}{\sqrt{50}} \quad (11a)$$

$$V_1 = \sqrt{50} \cdot (a1 + b1) \quad (11b)$$

$$a1 = \frac{1}{2}\left(\frac{V_1}{\sqrt{50}} + \sqrt{50} \cdot I_1\right) \quad (12a)$$

$$b1 = \frac{1}{2}\left(\frac{V_1}{\sqrt{50}} - \sqrt{50} \cdot I_1\right) \quad (12b)$$

a2 and b2 can be represented with the equations for $I_1$ and $V_1$ from the equations (12) and (10) as shown in the following equations (13).

$$a2 = \frac{\frac{1}{\sqrt{50}}(1 - S_{11})V_1 - \sqrt{50} \cdot (1 + S_{11})I_1}{2S_{12}} \quad (13a)$$

$$b2 = \frac{\frac{1}{\sqrt{50}}\left\{\frac{S_{12}S_{21} +}{S_{22}(1 - S_{11})}\right\}V_1 + \sqrt{50} \cdot \left\{\frac{S_{12}S_{21} -}{S_{22}(1 + S_{11})}\right\}I_1}{2S_{12}} \quad (13b)$$

In addition, the following equation (14) represents the relationship between output side current signal $I_2$ and voltage signal $V_2$ and output side incident wave a2 and reflected wave b2. $I_2$ and $V_2$ can be represented with the formulas of I1 and V1 from the following equation (14) and equation (13) as shown in the following equation (15). The following equation (15) is used to calculate the output side current signal $I_2$ and voltage signal $V_2$ from the input side current signal $I_1$ and voltage signal $V_1$. Thus, the calibrated current signal $I_2$ and voltage signal $V_2$ can be calculated from the current signal $I_1$ and voltage signal $V_1$ according to the following equation (15).

$$I_2 = \frac{b2 - a2}{\sqrt{50}} \quad (14a)$$

$$V_2 = \sqrt{50} \cdot (b2 + a2) \quad (14b)$$

$$I_2 = \frac{\frac{1}{50}\left\{\frac{S_{12}S_{21} -}{(1 - S_{11})(1 - S_{22})}\right\}V_1 + \left\{\frac{S_{12}S_{21} +}{(1 + S_{11})(1 - S_{22})}\right\}I_1}{2S_{12}} \quad (15a)$$

$$V_2 = \frac{\left\{\frac{S_{12}S_{21} +}{(1 - S_{11})(1 + S_{22})}\right\}V_1 + 50\left\{\frac{S_{12}S_{21} -}{(1 + S_{11})(1 + S_{22})}\right\}I_1}{2S_{12}} \quad (15b)$$

Figure 4B:
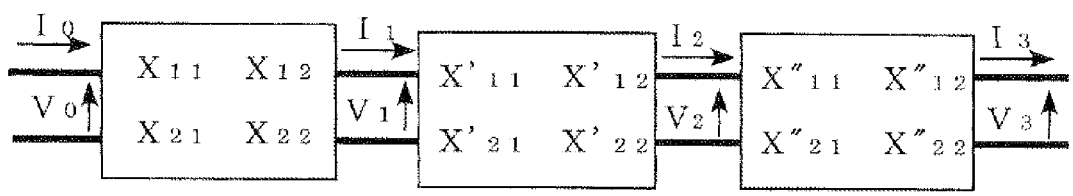

The method for calculating the third calibration parameter X" is similar to that used to calculate the first calibration parameter X. When the relationship between current signal $I_2$ and voltage signal $V_2$ output from the second calibration unit 383 and the high-frequency current flowing to the plate electrode 41a within the chamber of the plasma processing device 4 and the high-frequency voltage generated at the plate electrode 41a within the chamber of the plasma processing device 4 are replaced with a two-terminal pair network in the same manner as previously described, the third calibration parameter X" for calibrating the current signal $I_2$ and the voltage signal $V_2$ to the current signal $I_3$ and the voltage signal $V_3$ can be considered to be a two-dimensional vector matrix as shown on the right side of FIG. 4B. Furthermore, FIG. 4B overall shows the calibration circuit 38 that outputs the calibrated current signal $I_3$ and voltage signal $V_3$ obtained by converting the current signal $I_0$ and the voltage signal $V_0$ according to the first calibration parameter X, the second calibration parameter X' and the third calibration parameter X" that are two-dimensional vector matrices.

The respective elements $X''_{11}$, $X''_{12}$, $X''_{21}$ and $X''_{22}$ of the third calibration parameter X" are also calculated from the measured impedance values of three reference loads respectively measured by the high-frequency measuring device 3 when the three reference loads are reproduced and from the true impedance values of the three reference loads in the same manner as previously described.

Furthermore, although it is necessary for one of the three reference loads to have the characteristic impedance (50Ω) in the same manner as previously described, the remaining two reference loads are determined based on the range of change of the impedance during plasma processing of the plasma processing device 4. Namely, points B' and C' are determined so that a narrow impedance range E that includes that range of change of the impedance is encompassed by a point A' that indicates the characteristic impedance (see FIG. 1B), and loads having the impedances indicated by points B' and C' are determined for the reference loads.

However, the current signal $I_2$ and voltage signal $V_2$ represent current and voltage signals at the plate electrode 41a within the chamber of the plasma processing device 4 when the high-frequency measuring device 3 is arranged in the plasma processing system A that is actually used (see FIG. 2). Thus, it is necessary to reproduce the three reference loads at the plate electrode 41a within the chamber of the plasma processing device 4 of the plasma processing system A.

Figure 8:
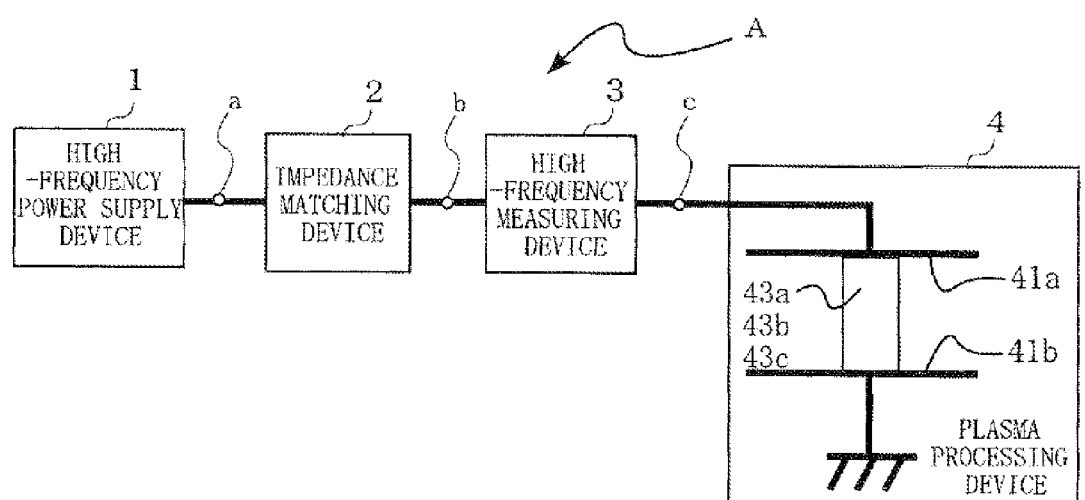
FIG. 8 is a drawing for explaining a method for measuring an impedance of a reference load that is carried out to calculate each element of a third calibration parameter.

FIG. 8 is a drawing for explaining a method for measuring an impedance of a reference load that is carried out to calculate each of elements $X''_{11}$, $X''_{12}$, $X''_{21}$ and $X''_{22}$ of the third calibration parameter X".

Figure 9:
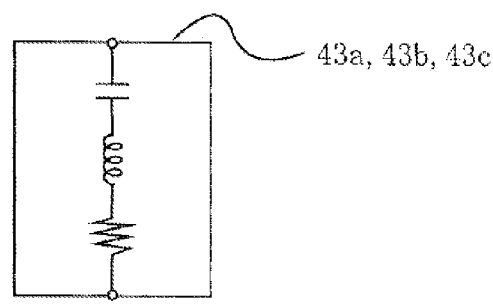
FIG. 9 is a circuit diagram showing an example of a reference load.

As shown in the drawing, this measurement is carried out by arranging the high-frequency measuring device 3 in the plasma procreating system A that is actually used (see FIG. 2), and arranging three reference loads 43a, 43b and 43c between the plate electrons 41a and 41b within the chamber of the plasma processing device 4. Each reference load 43a, 43b and 43c is fabricated by combining, for example, a resistor, a capacitor and an inductor shown in FIG. 9, and comprises loads having the impedances indicated by points A', B' and C'. Furthermore, FIG. 9 merely represents an example, and there are no particular limitations on the configuration of the reference loads 43a, 43b and 43c. Furthermore, instead of arranging the three reference loads 43a, 43b and 43c in sequence, the three reference loads may be reproduced by switching a single variable load.

Measurement of the impedances of the reference loads for calculating the third calibration parameter X" is carried out by respectively arranging each of the reference loads 43a, 43b and 43c between the plate electrode 41a and plate electrode 41b of the plasma processing device 4, and respectively measuring the impedance of each with the high-frequency measuring device 3. Furthermore, true values of the impedances measured by the high-frequency measuring device 3 are the impedances of each of the reference loads 43a, 43b and 43c.

Each of the elements $X''_{11}$, $X''_{12}$, $X''_{21}$ and $X''_{22}$ of the third calibration parameter X" can be calculated from the measured impedance values of the three reference loads 43a, 43b and 43c measured by the high-frequency measuring device and the true values of the impedances of the three reference loads. The current signal $I_2$ and voltage signal $V_2$ can be converted to a calibrated current signal $I_3$ and voltage signal $V_3$ according to FIG. 4B. Namely, the calibrated current signal $I_3$ and the voltage signal $V_3$ can be calculated according to the following equations (16) and (17) derived according to FIG. 4B.

$$\begin{bmatrix} V_2 \\ V_3 \end{bmatrix} = \begin{bmatrix} X''_{11} & X''_{12} \\ X''_{21} & X''_{22} \end{bmatrix} \begin{bmatrix} I_2 \\ -I_3 \end{bmatrix} \quad (16)$$

$$V_2 = X''_{11} I_2 - X''_{12} I_3$$

$$V_3 = X''_{21} I_2 - X''_{22} I_3$$

$$I_3 = \frac{X''_{11}}{X''_{12}} I_2 - \frac{1}{X''_{12}} V_2$$

$$V_3 = \frac{(X''_{12} X''_{21} - X''_{11} X''_{22})}{X''_{12}} I_2 + \frac{X''_{22}}{X''_{12}} V_2 \quad (17)$$

The impedance calculation circuit 39 is used to calculate an impedance. The impedance calculation circuit calculates and outputs an impedance Z according the previously described equations (1) to (3) from the calibrated effective current value I', effective voltage value V' and phase difference θ' input from the calibration circuit 38. Furthermore, although the high-frequency measuring device 3 also calculates and outputs high-frequency parameters such as forward power Pf and reflected power Pr, a description of a configuration that calculates these parameters is omitted from the drawings.

Figure 10:
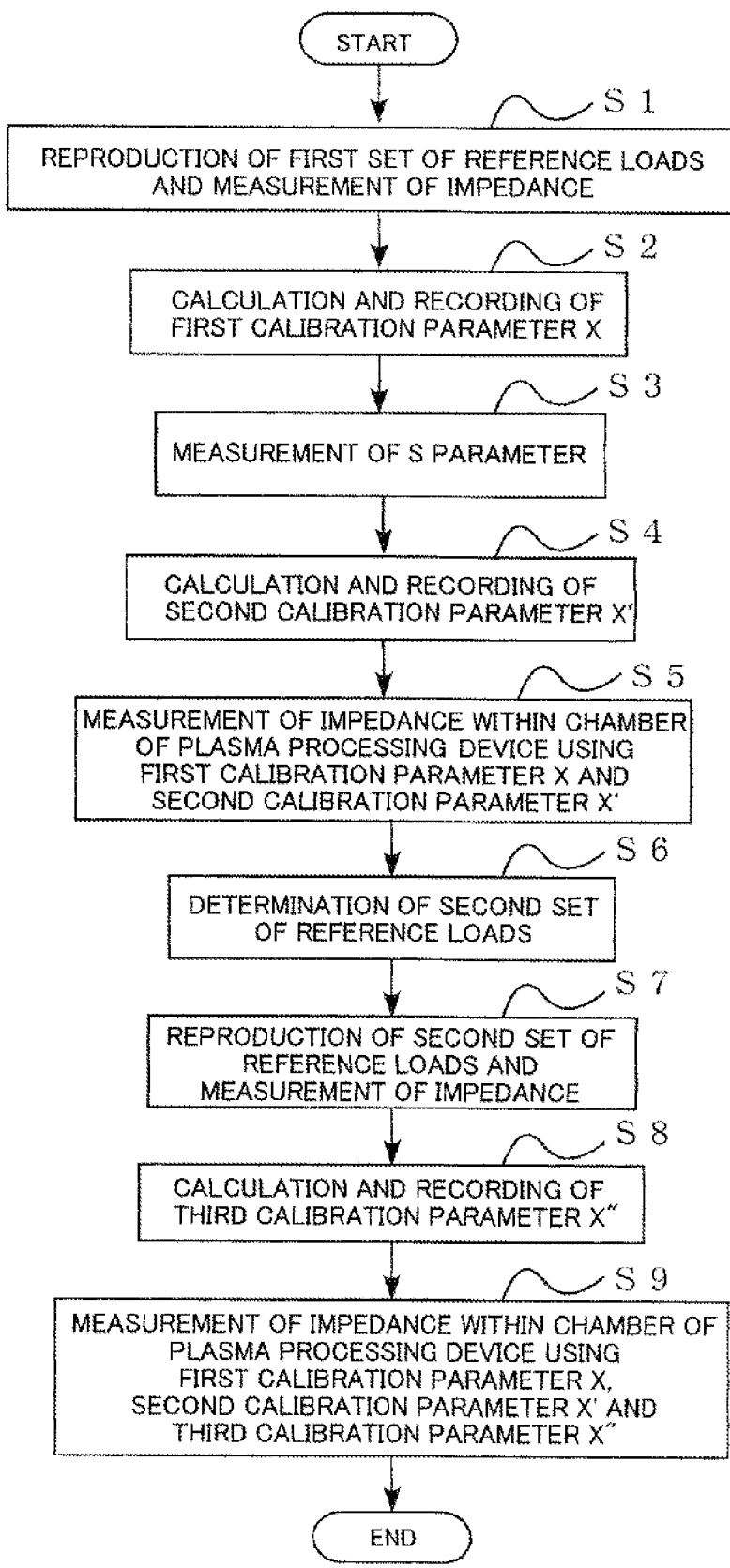
FIG. 10 is a flow chart for explaining the procedure of a high-frequency measuring device calibration method according to a first embodiment.
Figure 11:
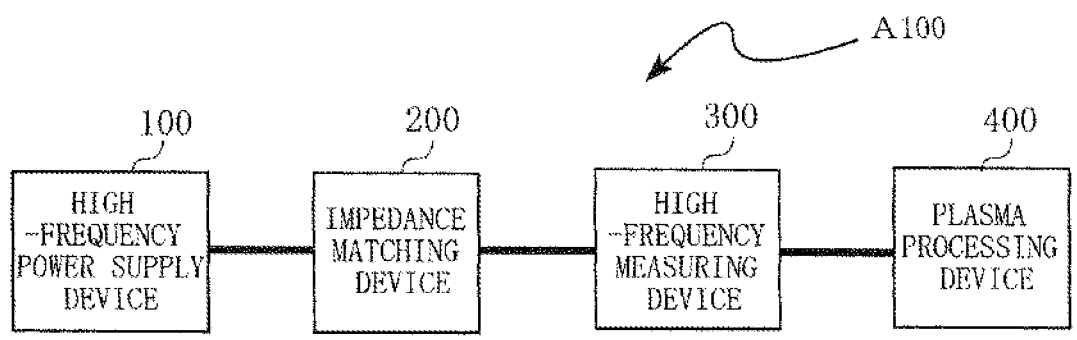
FIG. 11 is a block diagram showing the configuration of a typical plasma processing system.

Next, an explanation is provided of a procedure for carrying out calibration of the high-frequency measuring device 3 with reference to the flow chart shown in FIG. 10.

FIG. 10 is a flow chart for explaining a procedure for calibrating the high-frequency measuring device 3. This flow chart indicates a processing procedure for carrying out calibration of the detected current signal $I_0$ and voltage signal $V_0$ in the case of measuring an impedance of the plasma processing device 4 (device to be measured) with the high-frequency measuring device 3.

First, the dummy load 6 and the impedance analyzer 7 are connected to the high-frequency measuring device 3 (see FIG. 5), a first set of reference loads is reproduced by the dummy load 6, and an impedance is respectively measured with the impedance analyzer 7 and the high-frequency measuring device 3 (S1). Furthermore, since three reference loads are provided for the first set of reference loads, each first reference load is reproduced and the impedance of each is respectively measured by the impedance analyzer 71 and the high-frequency measuring device 3. The first set of reference loads consists of a reference load having the characteristic impedance (50Ω), and two reference loads having reflection coefficients of 0.9 or less and the impedances near the open-circuit impedance and the short-circuit impedance, respectively.

The first calibration parameter X is calculated from the respective impedances of the first set of three reference loads measured by the impedance analyzer 7 and the high-frequency measuring device 3 in step S1, and then recorded in a memory not shown of the high-frequency measuring device 3 (S2). In the present embodiment, an arithmetic processing circuit not shown of the high-frequency measuring device 3 records the impedance calculated with the impedance calculation circuit 39 and the impedance input from the impedance analyzer 7 in memory, calculates each of the elements of the first calibration parameter X after measuring the first set of three reference loads, and then records the elements in memory. Furthermore, calculation of the first calibration parameter X is not limited to the case of being carried out by the arithmetic processing circuit of the high-frequency measuring device 3, but rather, for example, may be carried out separately by a worker. In this case, the first calibration parameter is recorded in memory by the worker inputting the first calibration parameter X with input means not shown of the high-frequency measuring device 3.

Next, the high-frequency measuring device 3 is connected to the plasma processing device 4 (see FIG. 6) in the same manner as the plasma processing system A that is actually used (see FIG. 2), and the S parameter is measured between the input end b of the high-frequency measuring device 3 and the electrode plate 40a on the electrical power supply side within the chamber of the plasma processing device 4 with the network analyzer 8 (S3).

The second calibration parameter X' is calculated from the S parameter measured by the network analyzer 8 in step S3, and then recorded in memory not shown of the high-frequency measuring device 3 (S4). In the present embodiment, an arithmetic processing circuit not shown of the high-frequency measuring device 3 calculates each of the elements of the second calibration parameter X' from the S parameter input from the network analyzer 8 and records the elements in memory. Furthermore, calculation of the second calibration parameter X' is not limited to the case of being carried out by an arithmetic processing circuit of the high-frequency measuring device 3, but rather, for example, may be carried out separately by a worker. In this case, the second calibration parameter X' is recorded in memory by the worker inputting the second calibration parameter X' with input means not shown of the high-frequency measuring device 3.

Next, the high-frequency measuring device 3 is installed in the actually used plasma processing system A (see FIG. 2), and the impedance within the chamber of the plasma processing device 4 during actual plasma processing is measured (S5). At this time, the high-frequency measuring device 3 calibrates the current signal $I_0$ and the voltage signal $V_0$ with the first calibration parameter X and the second calibration parameter X' recorded in memory, and calculates the impedance Z based on the calibrated current signal $I_2$ and voltage signal $V_2$. Thus, the impedance Z measured by the high-frequency measuring device 3 is an impedance within the chamber of the plasma processing device 4, and although it is not highly accurate, it can be trusted to a certain degree.

The range of change of the impedance within the chamber of the plasma processing device 4 during plasma processing is confirmed from the impedance measured by the high-frequency measuring device 3 in step S5 followed by determination of the second set of reference loads (S6). One of the second set of reference loads is a reference load having the characteristic impedance (50Ω), while the remaining two reference loads are determined based on the range of change of the impedance within the chamber during plasma processing. In the present embodiment, an arithmetic processing circuit not shown of the high-frequency measuring device 3 determines the impedances of the remaining two reference loads based on the impedance Z calculated with the impedance calculation circuit 39. Furthermore, determination of the impedances of the remaining two reference loads is not limited to the case of being carried out by the arithmetic processing circuit of the high-frequency measuring device 3, but rather, for example, may be carried out separately by a worker based on measured values of the impedance.

Next, a second set of reference loads 43a, 43b and 43c is arranged in sequence in the plasma processing device 4 of the plasma processing system A (see FIG. 8) followed by measuring the impedances thereof with the high-frequency measuring device 3 (S7). Furthermore, since three of the second set of reference loads 43a, 43b and 43c are set, the impedance of each is measured with the high-frequency measuring device 3.

The third calibration parameter X" is calculated from the respective impedances of the reference loads 43a, 43b and 43c measured by the high-frequency measuring device 3 in step S7 and from the true values of the impedances of the reference loads 43a, 43b and 43c, and then recorded in memory of the high-frequency measuring device 3 (S8). In the present embodiment, an arithmetic processing circuit of the high-frequency measuring device 3 records the impedance calculated with the impedance calculation circuit 39 in memory, calculates each of the elements of the third calibration parameter X" after measuring the second set of three reference loads, and then records the elements in memory. Furthermore, calculation of the third calibration parameter X" is not limited to the case of being carried out by the arithmetic processing circuit of the high-frequency measuring device 3, but rather, for example, may be carried out separately by a worker. In this case, the third calibration parameter X" is recorded in memory by the worker inputting the third calibration parameter X" with input means not shown of the high-frequency measuring device 3.

Next, the impedance within the chamber of the plasma processing device 4 during actual plasma processing is measured (S9). At this time, the high-frequency measuring device 3 calibrates the current signal $I_0$ and the voltage signal $V_0$ with the first calibration parameter X, the second calibration parameter X' and the third calibration parameter X" recorded in memory, and calculates the impedance Z from the effective current value I', the effective voltage value V' and the phase difference 8' based on the calibrated current signal $I_3$ and voltage signal $V_3$. Since the accuracy of calibration by the third calibration parameter X" is sufficiently high, the current signal $I_0$ and the voltage signal $V_0$ can, be calibrated with high accuracy. Thus, the effective current value I' and the effective voltage value V' measured by the high-frequency measuring device 3 as well as the impedance Z are highly accurate and reliable.

Furthermore, the calibration processing procedure described above is used in the case the first calibration parameter X, the second calibration parameter X' and the third calibration parameter X" are not recorded in memory of the high-frequency measuring device 3. It is not necessary to repeatedly carry out steps S1 and S2 of this processing procedure, but rather is only required to be carried out once to record the first calibration parameter X in memory. This processing may also be carried out by the manufacturer during production of the high-frequency measuring device 3. On the other hand, the processing of step S3 and beyond is required to be carried out each time the contents of plasma processing (such as the type of gas used or gas pressure) change, or the plasma processing device 4 installed with the high-frequency measuring device 3 changes, or the type or length of the transmission line between the high-frequency measuring device 3 and the plasma processing device 4 changes.

As has been described above, three stages of calibration are carried out in the present invention. Namely, in addition to first carrying out calibration with a first calibration parameter X enabling calibration at low accuracy over a wide impedance range, calibration is carried out with a second calibration parameter X' that converts a detection point of high-frequency current and high-frequency voltage from a connection point where the high-frequency measuring device 3 is connected to inside the chamber of the plasma processing device 4 to confirm the range of change of the impedance within the chamber of the plasma processing device 4. Next, calibration is carried out with a third calibration parameter X" with high accuracy only over that range of change. Since the first calibration parameter X enables calibration to be carried out at low accuracy over a wide impedance range, the range of change of the impedance, the location of which is initially unknown, can be confirmed. Since the third calibration parameter X" is determined to carry out calibration only over an impedance range that is narrower than that of the first calibration parameter X, in the case the impedance is within that range, the accuracy of calibration according to the third calibration parameter X" becomes sufficiently high. Thus, detected voltage and current can be calibrated with high accuracy. In addition, since the second calibration parameter X' converts a detection point of a high-frequency current and a high-frequency voltage from a connection point where the high-frequency measuring device 3 is connected to the inside of the chamber of the plasma processing device 4, an impedance within the chamber of the processing device 4 can be measured.

Furthermore, although the example of the case of the plasma processing device 4 being a CCP type of plasma processing device has been explained in the present embodiment, the present invention is not limited thereto. The present invention can be applied using a method similar to that described above even if the electrodes for generating plasma are opposing parallel plate electrodes. In addition, even in the case of not using parallel plate electrodes, the present invention can be applied provided the parameter S can be measured between the input end b of the high-frequency measuring device 3 and an electrode on the electrical power supply side within the chamber of the plasma processing device 4, and reference loads can be reproduced between the electrode on the electrical power supply side and ground side within the of the plasma processing device 4.

The high-frequency measuring device and high-frequency measuring device calibration method according to the present invention are not limited to the above-mention embodiments. In addition, the design of the specific configuration of each portion of the high-frequency measuring device according to the present invention can be modified in various ways.

The invention claimed is:

1. A method for calibrating voltage values and current value of a high-frequency measuring device that is connected to a connection point between a plasma processing device for generating plasma within a chamber and a high-frequency power supply device for supplying high-frequency electrical power to the plasma processing device, the high-frequency measuring device being configured to detect high-frequency voltage and high-frequency current at the connection point, and to calculate an impedance within the chamber of the plasma processing device based on the detected voltage and current values, the method comprising:

a first step of calculating a first parameter for calibrating the voltage and current values based on impedances calculated when the high-frequency measuring device is connected to a first set of three reference loads and impedances of the first set of three reference loads;

a second step of calculating a second parameter for respectively converting the detected voltage and current values to voltage and current values within the chamber;

a third step of carrying out plasma processing by connecting the high-frequency measuring device to a plasma processing device to be measured, calibrating the detected voltage and current values using the first parameter and the second parameter, and calculating impedances within the chamber based on the calibrated voltage and current values;

a fourth step of determining three impedances that encompass, when displayed on a Smith chart, a narrower range than a range encompassed by the impedances of the first set of three reference loads, the narrower range including the impedance calculated in the third step;

A fifth step of calculating a third parameter for further calibrating the voltage and current values calibrated using the first parameter and the second parameter, based on impedances measured by the high frequency measuring device connected to the plasma processing device when a second set of three reference loads respectively having the three impedances determined in the fourth step is arranged within the chamber of the plasma processing device to be measured, and based on the impedances of the second set of three reference loads; and a sixth step of connecting the high-frequency measuring device to the plasma processing device to be measured and calibrating detected voltage and current values, using the first parameter, the second parameter and the third parameter.

2. The calibration method according to claim 1, wherein the second parameter is calculated from a set of S parameters measured between the connection point and a point within the chamber of the plasma processing device.

3. The calibration method according to claim 2, wherein one of the reference loads among the first set of three reference loads has an impedance equal to a characteristic impedance of the high-frequency measuring device.

4. The calibration method according to claim 3, wherein the plasma processing device includes a pair of opposing parallel plate electrodes providing in the chamber.

5. The calibration method according to claim 2, wherein the plasma processing includes a pair of opposing parallel plate electrodes provided in the chamber.

6. The calibration method according to claim 1, wherein one of the reference loads among the first set of three reference loads has an impedance equal to a characteristic impedance of the high-frequency measuring device.

7. The calibration method according to claim 6, wherein the plasma processing device includes a pair of opposing parallel plate electrodes provided in the chamber.

8. The calibration method according to claim 1, wherein the plasma processing device includes a pair of opposing parallel plate electrodes provided in the chamber.

9. A high-frequency measuring device that is connected to a connection point between a plasma processing device for generating plasma within a chamber and a high-frequency power supply device, the high-frequency measuring device comprising;

a voltage detector for detecting high-frequency voltage at the connection point;

a current detector for detecting high-frequency current at the measurement point;

a calibrator for calibrating a voltage value detected by the voltage detector and a current value detected by the current detector; and an impedance calculator for calculating an impedance within the chamber of the plasma processing device based on the voltage and current values calibrated by the calibrator, wherein the calibrator is provided with:

a first calibration unit for calibrating the detected voltage and current values using a first parameter calculated based on impedances calculated by the impedance calculator when the high-frequency measuring device is connected to a first set of three reference loads and impedances of the first set of three reference loads;

a second calibration unit for calibrating the voltage and current values calibrated by the first calibration unit, using a second parameter for respectively converting the detected voltage and current values to voltage and current values within the chamber; and a third calibration unit for further calibrating the voltage and current values calibrated by the first calibration unit and the second calibration unit, using a calculated third parameter based on impedances measured by the high-frequency measuring device connected to the plasma processing device when a second set of three reference loads, which encompass a range narrower than a range encompassed by the impedances of the first set of three reference loads when displayed on a Smith chart, is arranged in the chamber of a plasma processing device to be measured, and based on impedances of the second set of three reference loads.

10. The calibration method according to claim 9, wherein the second parameter is calculated from a set of S parameters measured between the connection point and a point within the chamber of the plasma processing device.

11. The high-frequency measuring device according to claim 10, wherein the plasma processing device includes a pair of opposing parallel plate electrodes provided in the chamber.

12. The high-frequency measuring device according to claim 9, wherein one of the reference loads among the first set of three reference loads has an impedance equal to a characteristic impedance of the high-frequency measuring device.

13. The high-frequency measuring device according to claim 12, wherein the plasma processing device includes a pair of opposing parallel plate electrodes provided in the chamber.

14. The high-frequency measuring device according to claim 10, wherein one of the reference loads among the first set of three reference loads has an impedance equal to a characteristic impedance of the high-frequency measuring device.

15. The high-frequency measuring device according to claim 14, wherein the plasma processing device includes a pair of opposing parallel plate electrodes provided in the chamber.

16. The high-frequency measuring device; according to claim 9, wherein the plasma processing device includes a pair of opposing parallel plate electrodes provided in the chamber.

* * * * *